United States Patent [19]
Jones, Jr. et al.

[11] Patent Number: 5,134,312
[45] Date of Patent: Jul. 28, 1992

[54] SHARED CURRENT SOURCE FOR ALPHA PARTICLE INSENSITIVE BIPOLAR LATCH

[75] Inventors: Frederick J. Jones, Jr., Leominister; David L. McCall, Medway; John H. Hackenberg, Northboro, all of Mass.

[73] Assignee: Digital Equipment Corporation, Maynard, Mass.

[21] Appl. No.: 691,454

[22] Filed: Apr. 25, 1991

[51] Int. Cl.$^5$ .................... H03K 3/289; H03K 19/086
[52] U.S. Cl. ................... 307/272.2; 307/289; 307/455; 307/467
[58] Field of Search ............ 307/272.1, 272.2, 289, 307/455, 467

[56] References Cited

U.S. PATENT DOCUMENTS

| | | | |
|---|---|---|---|
| 4,777,388 | 10/1988 | Widener | 307/272.2 |
| 4,779,009 | 10/1988 | Tsunoi et al. | 307/272.2 |
| 4,825,097 | 4/1989 | Bazil et al. | 307/272.2 |
| 5,001,361 | 3/1991 | Tamamura et al. | 307/272.2 |

FOREIGN PATENT DOCUMENTS

| | | | |
|---|---|---|---|
| 0249515 | 10/1987 | Japan | 307/272.1 |
| 0067812 | 3/1990 | Japan | 307/272.2 |

OTHER PUBLICATIONS

Okabe et al., "Design for Reducing Alpha-Particle-Induced Soft Errors in ECL Logic Circuitry", Journal of Solid-State Circuits, Oct. 1989, pp. 1397-1403.

Primary Examiner—Stanley D. Miller
Assistant Examiner—Trong Phan
Attorney, Agent, or Firm—Arnold, White & Durkee

[57] ABSTRACT

A bipolar ECL latch or flip-flop circuit of the isolated differential feedback type provides a high level of alpha particle immunity, without unduly affecting the propagation delay, power dissipation or circuit area in an integrated circuit device. A pair of latch transistors having differential input are used, with common emitters coupled to a clocked current source. The latch outputs are coupled back to a pair of holding transistors by two emitter follower feedback transistors. The holding transistors have a common emitter connection to a current source clocked inversely to that of the current source for the latch transistors, so the state of the latch is held by the holding transistors. The amplification of the feedback transistors is reduced so that the speed with which the transistor can react to transient noise such as that produced by an alpha hit is reduced. A shared current source is employed for the emitter follower feedback transistors to reduce the alpha particle sensitivity by lowering the feedback current without requiring two larger resistor values.

23 Claims, 2 Drawing Sheets

SHARED CURRENT SOURCE FOR ALPHA PARTICLE INSENSITIVE BIPOLAR LATCH

BACKGROUND OF THE INVENTION

This invention relates to semiconductor integrated circuit devices, and more particularly to bipolar latch and flip flop circuits rendered insensitive to alpha particles by a shared current source.

As bipolar transistor devices fabricated in integrated circuits reach submicron geometries, latch circuits and flip-flops constructed using these transistors become susceptible to state changes from alpha particle strikes. An alpha particle striking a silicon substrate generates a time-distributed charge as it passes through the silicon lattice. Alpha radiation is emitted from many sources, such as the metal within integrated circuit devices themselves, chip encapsulant, and packaging materials, so the radiation cannot be eliminated. Thus the effects of the alpha radiation must be minimized. A latch or flip-flop failure can occur when an alpha particle strikes the chip and generates current that flows into the collector of a transistor used to maintain the latch state. If the charge is fed back to a "high" base, it can pull the base "low" and change the state of the latch.

In previous construction of bipolar integrated circuits, the noise current generated by alpha particle hits was not sufficient to cause problems because the geometries of the bipolar transistors was larger and the operating currents were larger. However, as process geometries approach 1 μm and lower, parasitic

SUMMARY OF THE INVENTION

In accordance with one embodiment of the invention, a bipolar latch or flip-flop circuit is constructed in a manner to provide a high level of alpha particle immunity, without unduly affecting the propagation delay, power dissipation or circuit area in an integrated circuit device. The circuit employs a pair of latch transistors having differential input, with common emitters coupled to a clocked current source; the latch is responsive to the input only when this current source is clocked on. The outputs of the latch transistors are coupled back to a pair of holding transistors by two feedback transistors connected as emitter followers. The holding transistors have a common emitter connection to a current source clocked in opposition to that of the latch transistors, so the state of the latch is held by the holding transistors when the input clock is off.

This type of bipolar ECL latch circuit is referred to as a differential feedback latch, which is preferable to a single-ended feedback latch because it produces a lower voltage on the base of the transistor in the cutoff state, essentially doubling the voltage that a "high" base must be pulled down before a state upset occurs. The feedback is isolated (from the latch output) to prevent degrading the latch setup and hold time due to intercell routing RC effects.

The amplification of the feedback transistors in the latch circuit is reduced so that the speed with which the transistor can react to transient noise such as that produced by an alpha hit is reduced. This reduction in amplification in the feedback path thus has the effect of increasing the alpha immunity. This amplification can be reduced by reducing the current through the current sources of the feedback path. Often this current is set to no lower than half the value of capacitances that provided immunity in former geometries are no longer as effective. Several techniques have been published which address this problem.

A technique for hardening latch circuits to the effects of alpha particle hits is described by Okabe et. al, in "Design for Reducing Alpha-Particle-Induced Soft Errors in ECL Logic Circuitry" published in IEEE Journal of Solid-State Circuits, October 1985, pp. 1397–1403. These circuits were also described by Okabe et. al. in "An ECL Gate Array Hardened Against Soft Errors", ISSCC Digest of Technical Papers, February 1987. These "soft-error hardened" circuits use a single-ended feedback latch which adds a pair of transistors and a resistor to the feedback path of the latch, thereby limiting amplification of an alpha hit through the emitter follower driving the latch transistors. This technique does increase alpha immunity over standard latch designs, but does not provide the needed amount of immunity for a sub-micron technology. Experimental indications are that an immunity of 200-femtoCoulombs is needed to provide a soft error rate of less than 50 FITs, which is a specified level for marketable devices. The Okabe circuit does not provide this level of immunity in a sub-micron technology, and also the circuit has added complexity and cost due to adding two transistors and a resistor to the circuit; further the circuit requires an added current source. The extra current source adds to the power dissipation of the latch.

Other circuits for alpha-immune latches have been proposed, but in a similar manner these circuits have introduced additional components, requiring more area, and added power dissipation. Performance has been degraded in these circuits due to added capacitance at the switching nodes, increasing the propagation delay. the switch current. Reduction of this current to well below half this value has a significant effect on alpha particle immunity. States of a latch held with a lower switch current are more easily upset and thus require a lower feedback current than states which are held with a higher switch current.

To achieve the high level of immunity generally accepted as the standard (200 fC), feedback currents of less than 25 μA may be necessary. This low value of current through the feedback transistors would require very high values of resistors, which would consume substantial area in a cell. According to a major feature of the invention, a shared current source is employed for the emitter follower feedback transistors to reduce the alpha particle sensitivity by lowering the feedback current without requiring large resistor values. Two high value resistors are replaced by one resistor of half value, thus reducing the area required by 75%.

BRIEF DESCRIPTION OF THE DRAWINGS

The novel features believed characteristic of the invention are set forth in the appended claims. The invention itself, however, as well as other features and advantages thereof, will be best understood by reference to the detailed description of specific embodiments which follows, when read in conjunction with the accompanying drawings, wherein:

DETAILED DESCRIPTION OF SPECIFIC EMBODIMENTS

Figure 1:
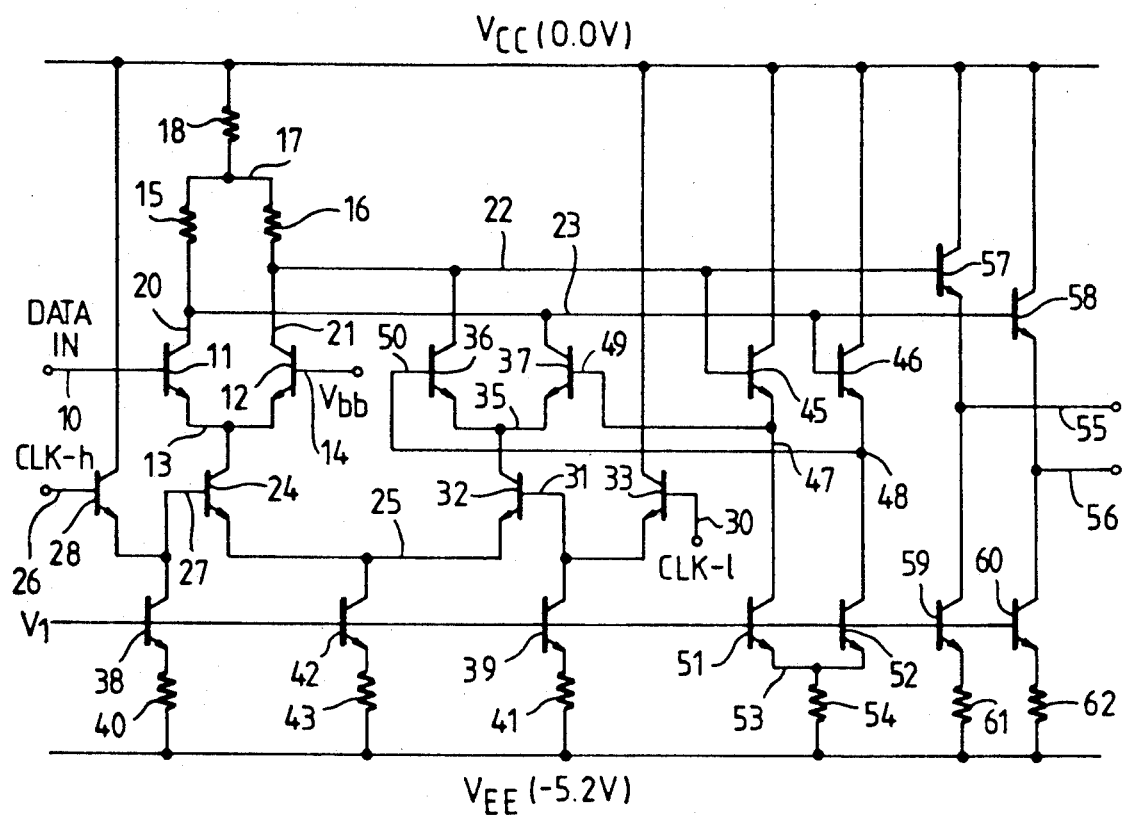
FIG. 1 is an electrical schematic diagram of a bipolar latch circuit constructed as an integrated circuit device, employing a shared current source according to one embodiment of the invention.

Referring to FIG. 1, an ECL bipolar latch circuit is illustrated which uses the features of one embodiment of the invention. The incoming data is a logic one or zero (ECL levels) applied to an input node 10 which is the base of an NPN transistor 11, one of the latch transistors. The other latch transistor is an NPN transistor 12 having a common emitter connection 13 with the transistor 11. This common emitter connection 13 is coupled to a clocked current source. The base 14 of the transistor 12 is connected to a voltage reference Vbb, so the circuit operates as a differential latch. The collectors of the two latch transistors are connected through separate load resistors 15 and 16 to a common node 17, which is connected to Vcc by another smaller resistor 18. Differential latch outputs are provided at the collectors 20 and 21 of the latch transistors on lines 22 and 23.

Figure 2:
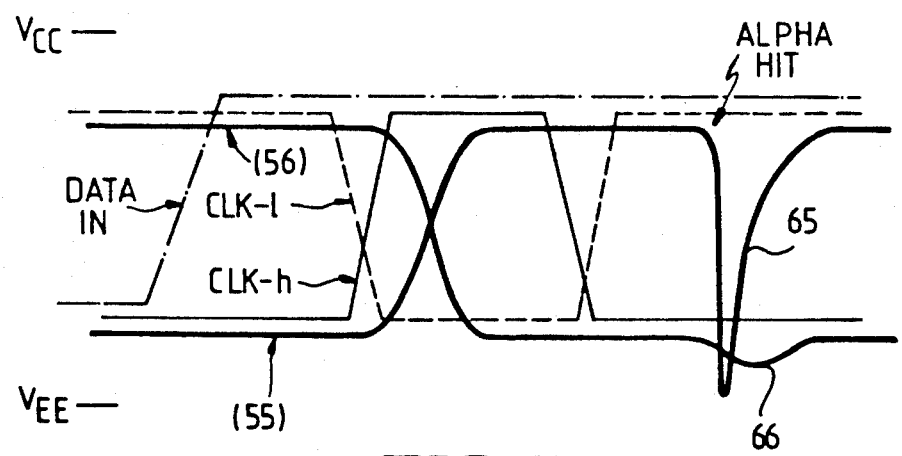
FIG. 2 is a timing diagram showing voltage waveforms appearing in the circuit of FIG. 1, plotted as a function of time.

The common emitter node 13 of the latch transistors is connected through the collector-emitter path of an NPN transistor 24 to a common node 25, and this transistor 24 is switched on when a Clk-h clock input 26 is high. This clock Clk-h is illustrated in FIG. 2. The clock input 26 is coupled to the base 27 of the transistor 24 by a transistor 28. Thus, when the Clk-h clock input 26 goes high, the base 27 goes high, and the transistor 24 turns on. The latch is thus in a condition non-responsive to the input when the clock Clk-h is low, and in a responsive or active state when this clock is high. When the Clk-h clock input 26 is low, another clock input 30 is high, as seen by the Clk-l waveform in FIG. 2. This Clk-l clock input 30 is applied to the base 31 of an NPN transistor 32 corresponding to the transistor 24 on the other side, this coupling being through a transistor 33 connected just as the transistor 28, so when the Clk-l clock input 30 goes high the base 31 goes high and the transistor 32 is turned on. The collector of the transistor 32 is connected to the common emitter node 35 of a pair of holding transistors 36 and 37 which serve to store the state of the latch when the Clk-h clock input 26 is low, as explained below. The emitters of the clock driver transistors 28 and 33 are returned to the common emitter voltage $V_{EE}$ by transistors 38 and 39, and resistors 40 and 41, providing current sources for the emitter followers 28 and 33. Likewise the common emitter node 25 is returned to the $V_{EE}$ voltage through a transistor 42 and a resistor 43, so the transistors 24 and 32 provide a clocked current source for the common emitter nodes 13 and 35 of the latch transistors and holding transistors. The bases of all three of these transistors 38, 39 and 42 are connected to a constant voltage supply $V_1$ selected to provide a current source of the desired level. The latch current or switching current level is established principally by the value of the resistor 43. The load resistors 15, 16 and 18 set the output voltage levels.

Feedback to the bases of the holding transistors 36 and 37 from the output lines 22 and 23 is by way of two emitter-followers employing NPN transistors 45 and 46, which have their emitters 47 and 48 connected to the base electrodes 49 and 50 of the transistors 37 and 36, respectively. The bases of the emitter-followers 45 and 46 are connected to the lines 22 and 23, so one of these transistors 45 and 46 will tend to be turned on higher than the other by the operation of the latch transistors 11 and 12 when the Clk-h clock 26 is high. This produces a voltage on one of the bases 49 or 50 which is higher than the other, turning on one of the transistors 36 or 37 more than the other (and tending to turn off the other by raising the emitter voltage or taking more of the emitter current due to the common emitter connection), and thus holding one of the lines 22 or 23 low and the other high. The emitters 47 and 48 of the emitter-follower feedback transistors 45 and 46 are connected through the collector-emitter paths of NPN transistors 51 and 52 which have their bases connected to the constant voltage supply $V_1$. The emitters of these two transistors 51 and 52 are connected to a common node 53 which is returned to the $V_{EE}$ supply through a resistor 54, providing the shared current source according to the invention.

The output lines 22 and 23 are connected to latch outputs 55 and 56 by a pair of separate emitter follower transistors 57 and 58 which have their bases connected to lines 22 and 23 and collectors connected to Vcc. The separate emitter-followers for the outputs 55 and 56 have current sources formed by the transistors 59 and 60 and resistors 61 and 62, returned to $V_{EE}$. The bases of the transistors 59 and 60 are connected to the voltage $V_1$. Note that the output emitter followers 57 and 58 are separate from or isolated from the emitter followers 45 and 46 in the feedback path. Also, separate $V_{EE}$ and $V_1$ sources may be used for these output emitter followers. Note that the output of the latch circuit can be taken directly from the lines 22 and 23 rather than using the emitter followers 57 and 58, if the circuit being driven does not require the additional level of isolation.

In operation of the latch circuit of FIG. 1, the function is the same as that of a standard D latch. The input 10 (Data In) is evaluated during the period when Clk-h is high, then the state is held while Clk-h is low and Clk-l is high, as seen in FIG. 2. When the Clk-h clock input 26 is high, the state of the latch is determined by the state of the data input 10 with reference to the voltage $V_{bb}$ on the input 14. If the Data In voltage at input 10 is higher than $V_{bb}$ the transistor 11 is turned on heavier, reducing the current in the transistor 12 by feedback through the common emitter 13. Conversely, if the input is lower than $V_{bb}$, the transistor 12 is turned on heavier, forcing the latch to the other state. The voltages on collectors 20 and 21 as seen in FIG. 2, and thus on output lines 22 and 23, are thus high or low according to the current through the transistors 11 and 12. When the Clk-h clock input 26 is low and the Clk-l clock input 30 is high, the state of the latch is stored in the transistors 36 and 37, due to the differential feedback via the emitters of the transistors 45 and 46.

According to this embodiment of the invention, current for the latch feedback is supplied by a shared current source consisting of the transistors 51 and 52 and the resistor 54. This current sharing technique provides a much lower effective current to both of the critical emitter followers 45 and 46. These emitter followers are critical because the mechanism for a latch upset is from an alpha strike to the collector of transistors 37, 36, 11 or 12 during the hold time. If an alpha particle strikes the substrate and reaches the collector region of the transistor 37 or 11, a current spike to the $V_{EE}$ supply appears at that collector node. This current is amplified by the emitter follower transistor 46 and brought to the base of the transistor 36. When this transistor 36 is conducting, this negative spike can bring the base lower than the base of transistor 37 and flip the state of the latch. Similarly, an alpha strike to the collector of transistor 36 or 12 is transmitted to the base of the transistor 37 through the emitter follower transistor 45 and can upset the state held of transistor 37 which has been conducting. Because the current source for the emitter follower transistors 45 and 46 is much smaller according to a feature of the invention, the transistors have much less drive than they would with a standard differential feedback scheme. This drive reduction greatly improves the immunity of the latch to state upset, without significantly affecting propagation delay through the latch. The propagation delay is not affected because the gain of these transistors 45 and 46 is only used for holding the state of the latch. Separate emitter followers drive the outputs 55 and 56 of the latch, as is usually the case. Without isolated feedback created by the extra pair of emitter followers 45 and 46, setup and hold times would be a function of interconnect length between circuits. The capacitance from this interconnect would directly affect these parameters.

The latch circuit described above using a shared current source according to the invention can be tuned to achieve virtually any desired alpha immunity in tradeoff for setup time. The higher the alpha immunity provided, the more the setup time will be compromised, but nevertheless substantial immunity can be provided without undue penalty in setup time. The values of the resistors 54 and 43, and the ratio of these resistors, are the variables. For example, in one technology, the resistors 54 and 43 can be of the following values:

| Resistor 54 | Resistor 43 | Switch Current |
| --- | --- | --- |
| 20 KΩ | 5 KΩ | 0.1 mA |
| 15 KΩ | 2.5 KΩ | 0.2 mA |
| 7.5 KΩ | 1.25 KΩ | 0.4 mA |

These circuits are designed to optimize setup time while maintaining protection against greater than 200-femto Coulombs or 200 fC (1.05 mA peak current) alpha hits to either collector 20 or 21. The time distributed generated current waveform for a 200 fC alpha strike may be derived from a paper entitled, "Current Modeling of Alpha-Particle Induced Soft Errors in Bipolar Memories", by Xiaonan Zhang and David McCall in the 1987 IEEE Proceedings of the Bipolar Circuits and Technology Conference. By reducing the current setting resistance 54 of the shared current source, setup time can be gained at the expense of alpha immunity. Alpha immunity increases as switch current in transistors 36 and 37 increases (i.e., lowering the value of the resistor 43) and as feedback current decreases (i.e., raising the value of the resistor 54). As switch current is increased, the smaller values of resistors 15 and 16 allow a faster recovery of the voltage on nodes 22 and 23 after an alpha strike.

In FIG. 2, the effect of an alpha hit on the collector 20 as reflected on the output voltages on outputs 55 and 56 is seen by a spike 65 on the high side and a bump 66 on the low side. Note that the spike actually crosses the level of the low side, but nevertheless does not upset the state of the latch and instead the outputs return to their original state, before the next clock tick. The low collector current of the feedback transistors 45 and 46 causes them to be too slow to pass on to the bases 49 and 50 the transient noise spike that reaches the bases of the transistors 45 and 46. This is accomplished by reducing the current of the shared current source formed by the resistor 54 and the transistors 51 and 52. The set up time (time Data In must be valid before Clk-h can go low) slowly degrades as the feedback current (current through resistor 54) is reduced, so an acceptable alpha immunity is selected with an acceptable penalty to set up time.

Figure 3:
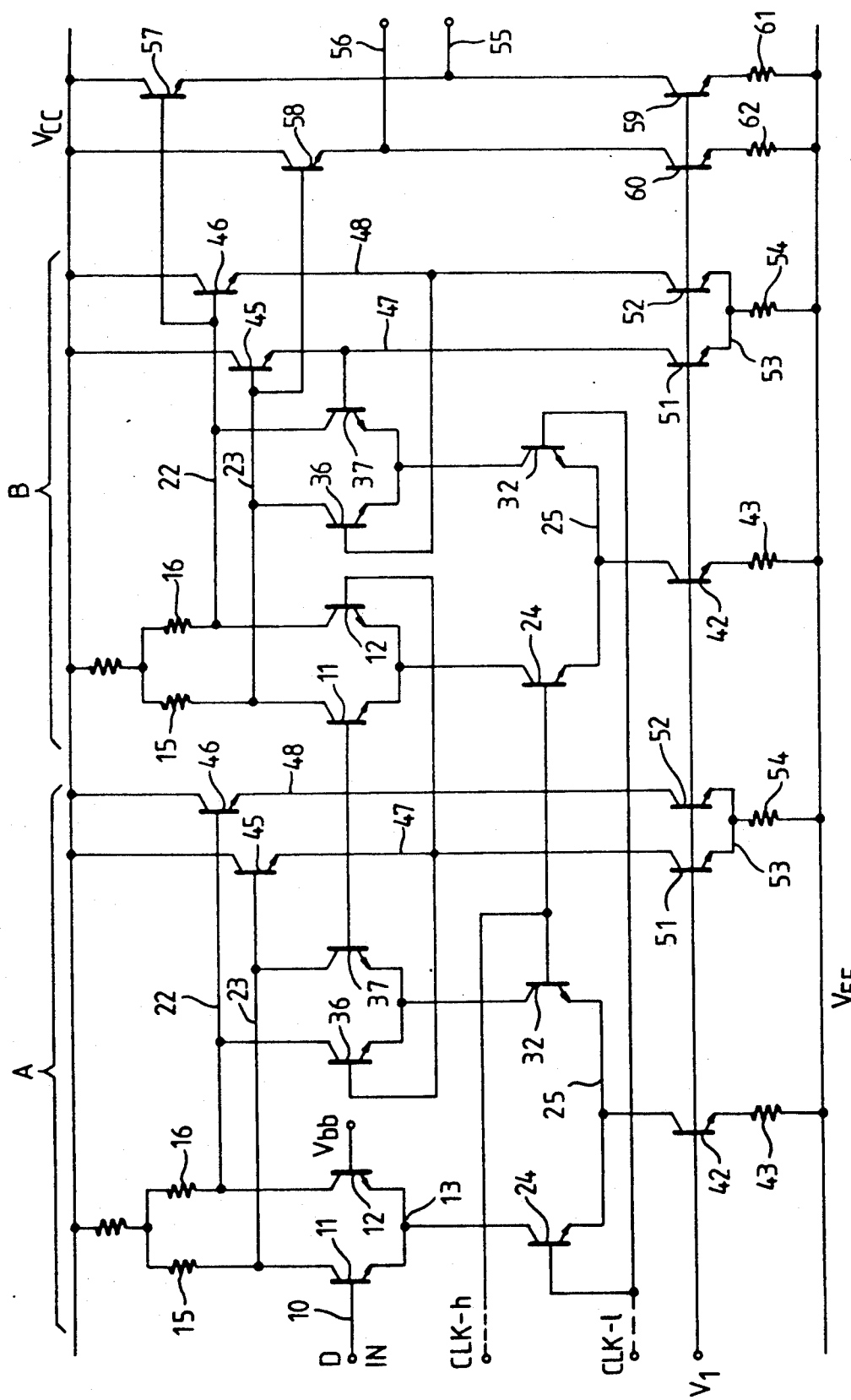
FIG. 3 is an electrical schematic diagram of a flip-flop circuit constructed using the latch circuit of FIG. 1, according to another embodiment of the invention.

Referring to FIG. 3, a flip-flop circuit may be formed by employing two of the latch circuits of FIG. 1, according to another embodiment of the invention. A latch circuit A contains the pair of latch transistors 11 and 12, and a pair of holding transistors 36 and 37, along with feedback transistors 45 and 46 and the shared current source including transistors 51 and 52 and resistor 54, just as in FIG. 1. The input 10 is the data input D, and the base of transistor 12 is connected to a reference voltage $V_{bb}$ as before. A second latch circuit B duplicates the same latch transistors 11 and 12, holding transistors 36 and 37, feedback transistors 45 and 46, and shared current source 51, 52, 54. The transistors 24 and 32 for both latch circuits A and B are coupled to clock sources Clk-h and Clk-l in phase opposition, but the connections are different. As seen in FIG. 3, Clk-h is connected to the base of transistor 32 in A and transistor 24 in B, while Clk-l is connected to the base of transistor 24 in latch A and the base of transistor 32 in latch B. The effect of this connection of the clocks is to permit latch A to evaluate D when Clk-l is high, then latch B evaluates the output of latch A when Clk-h is high and Clk-l is low and passes the information to the output 55, 56. As in FIG. 1, the clock inputs use transistors 28 and 33 and current sources 38 and 39 (not shown in FIG. 3). One output of the latch circuit A is taken from the emitter 48 of the transistor 46 and applied to the base of transistor 11 of the latch circuit B. The other output of A is taken at the emitter 47 of the transistor 45 and applied to the base of the transistor 12 of B. The outputs of circuit B are taken from the lines 22 and 23 via emitter follower transistors 57 and 58 having current sources 59 and 60, just as in FIG. 1 (for a CML output these can be omitted as mentioned above). In latch B the connections of the collectors and bases of transistors 36 and 37 appear to be reversed, compared to latch A, but the operation is seen to be the same since these transistors 36 and 37 are interchangeable. The shared current sources 51, 52 and 54 of latches A and B operate the same as in FIG. 1.

Latches and flip-flops consume a significant portion of silicon in most IC designs. Prior circuit design techniques for achieving alpha-hardened latches have been complex, requiring more components and/or current, and often possessing substantial performance losses. The shared current source latch achieves virtually any alpha immunity desired at no significant impact to power, area, or propagation delay. The only affected parameter is setup time. In fact, the technique uses less power and one less component than a standard differential-feedback latch. The area of the high-valued resistance 54 is minimized because its exact value is not critical to the operation of the circuit, so it is possible to use a narrower, more process sensitive resistor than the other, more critical resistors of the latch or flip-flop. Prior art designs which compromise area must also accept a reduced overall chip performance due to the increased average interconnect length to route over the larger latches and flip-flops.

The power savings of the shared current source type of latch is particularly important in sub-micron bipolar ICs where electromigration and total power consumption are becoming the limiting factors to ECL design. In previous technologies, the largest restriction to core usage had been die size and routing requirements.

Another advantage of the shared current source scheme is that the tradeoff between setup time and alpha immunity can be done simply by changing the value of one effective resistance 54. Some ECL processes will have a level of alpha immunity built in to the process itself. The effectiveness of the process-induced alpha immunity is not likely to be known until late in the design schedule. Architecture and latch and flip-flop design will likely need to be done before any alpha immunity testing can occur on the silicon. With the shared current source technique, if resistance 54 is constructed of multiple resistors in series, a conservative latch design can be done. If later testing reveals that the design can be relaxed, while maintaining the desired alpha immunity, a simple metal mask change can be done to bypass some of the resistance 54 in the feedback current source, improving the setup time. With the prior latch designs discussed, it would likely be much more difficult to retrofit the circuit design for a tradeoff in performance vs alpha immunity.

While this invention has been described with reference to specific embodiments, this description is not meant to be construed in a limiting sense. Various modifications of the disclosed embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A latch circuit comprising:
   a) first and second latch transistors, each having a base, emitter and collector, the emitters being connected together at a common emitter node, the collectors being connected through load impedance to a first voltage supply, and the bases being connected to a differential input;
   b) first and second holding transistors, each having a base, emitter and collector, the emitters being connected together at a common emitter node, the collectors being separately connected to said collectors of said first and second latch transistors;
   c) first and second feedback transistors connected as emitter followers, each having a base, emitter and collector, the emitters being connected separately to said bases of said holding transistors and also connected to a shared current source to limit the amplification of said emitter followers, the collectors being connected separately to said first voltage supply, and said bases being connected separately to said collectors of the first and second latch transistors; said shared current source including an impedance connected in series between a common point and a second voltage supply, said emitters of both of said feedback transistors being coupled to said common point through current-limiting means;
   d) current source means connected to said common emitter node of said latch transistors and to said common emitter node of said holding transistors to couple one of said common emitter nodes to said second voltage supply.

2. A latch circuit according to claim 1 wherein said impedance of said shared current source includes a resistor defining the amplification of the feedback path.

3. A latch circuit according to claim 1 wherein said current source means is clocked to activate either said latch transistors or said holding transistors at a given time, but not both.

4. A latch circuit according to claim 3 wherein said clocked current source means includes a resistor to define the latch current of said latch circuit.

5. A latch circuit according to claim 1 including a pair of output emitter followers connected to said collectors of said latch transistors separate from said emitter follower feedback transistors to provide outputs from said latch circuit.

6. A latch circuit according to claim 1 wherein said first voltage supply is substantially zero volts and said second voltage supply is a negative voltage, and wherein all of said transistors are NPN transistors.

7. A latch circuit according to claim 1 wherein said current source means is clocked by a first clock to activate said latch transistors and clocked by a second clock in opposition to said first clock to activate said holding transistors.

8. A method of operating a latch circuit, comprising the steps of:
   a) connecting a differential input to the bases of first and second latch transistors to set the state of the latch circuit by a logic input, each latch transistor having a base, emitter and collector, the emitters of said latch transistors being connected together at a common emitter node, the collectors being connected through load impedance to a first supply terminal;
   b) holding the state of said latch transistors by first and second holding transistors, each holding transistor having a base, emitter and collector, the emitters of the holding transistors being connected together at a common emitter node, the collectors being connected separately to the collectors of said latch transistors;
   c) feeding back the output of said latch transistors to the bases of said holding transistors by first and second emitter follower feedback transistors, each feedback transistor having a base, emitter and collector, the emitters being connected separately to the bases of said holding transistors and also connected to a shared current source having a common point, the collectors being connected separately to said first supply terminal, and said bases being connected separately to said collectors of the first and second latch transistors, and limiting the current through said shared current source by means including an impedance connected in series between said common point and a second supply terminal.

9. A method according to claim 8 including the step of clocking said latch transistors and said holding transistors by coupling one of said common emitter nodes of either the latch transistors or the holding transistors to a second supply terminal by a current source, thereby activating either said latch transistors or said holding transistors.

10. A method according to claim 8 including the step of coupling said collectors of said latch transistors to output terminals by emitter followers separate from said emitter follower feedback transistors to provide outputs from said latch circuit.

11. A method according to claim 8 wherein said impedance of said shared current source includes a resistor defining the amplification of the feedback path.

12. A method according to claim 8 including the step of clocking current source means connected to said common emitter nodes to thereby activate either said latch transistors or said holding transistors at a given time, but not both.

13. A method according to claim 12 wherein said clocked current source means includes a resistor to define the latch current of said latch circuit.

14. A method according to claim 8 wherein said first supply terminal is at substantially zero volts and said second supply terminal is at a negative voltage, and wherein all of said transistors are NPN transistors.

15. A bipolar circuit comprising:
a) first and second transistors, each having a base, emitter and collector, the emitters being connected together at a first common emitter node, the collectors being connected through loads to a first voltage supply, and the bases being separately connected to circuit inputs;
b) third and fourth transistors, each having a base, emitter and collector, the emitters being connected together at a second common emitter node, the collectors of the third and fourth transistors being separately connected to the collectors of the first and second transistors;
c) fifth and sixth feedback transistors connected as emitter followers, each having a base, emitter and collector, the emitters being separately connected to the bases of the third and fourth transistors and also connected to a shared current source, the collectors being connected separately to said first voltage supply, and said bases being connected separately to said collectors of the first and second transistors, said shared current source including an impedance connected in series between a common point and a second voltage supply, said emitters of both of said fifth and sixth feedback transistors being coupled to said common point through current-limiting means.

16. A circuit according to claim 15 including an activating circuit connected to said common emitter node of said first and second transistors and to said common emitter node of said third and fourth transistors to activate either said first and second transistors or said third and fourth transistors.

17. A circuit according to claim 16 wherein said activating circuit is clocked by a first clock to activate said latching transistors and by a second clock in phase opposition to said first clock to activate said holding transistors.

18. A circuit according to claim 15 wherein said impedance of said shared current source includes a resistor defining the amplification of the feedback path.

19. A circuit according to claim 15 including a pair of output emitter followers connected to said collectors of said first and second transistors to provide outputs from said circuit.

20. A circuit according to claim 15 forming a flip-flop and including:
a) a pair of latch transistors, each having a base, emitter and collector, the emitters being connected together at a first common emitter node, the collectors being connected through loads to said first voltage supply, and the bases being separately connected to said emitters of said fifth and sixth transistors;
b) a pair of holding transistors, each having a base, emitter and collector, the emitters being connected together at a third common emitter node, the collectors of the holding transistors being separately connected to the collectors of the latch transistors;
c) a pair of feedback transistors connected as emitter followers, each having a base, emitter and collector, the emitters being separately connected to the bases of the holding transistors and also connected to a shared current source, the collectors being connected separately to said first voltage supply, and said bases being connected separately to said collectors of the latch transistors.

21. A differential feedback bipolar latch circuit with isolated feedback paths, comprising:
a pair of latch transistors responsive to an input during a selected period and with a common emitter connection connected to a current source;
a pair of holding transistors coupled to said latch transistors for holding the state of the latch at times other than said selected period;
a pair of emitter follower feedback transistors responsive to the output of the latch transistors and having outputs connected to inputs of said holding transistors, and
a shared current source connected to emitters of said feedback transistors and limiting the amplification of feedback to said holding transistors, said shared current source including an impedance connected in series between a common point and a supply terminal, said emitters of both of said feedback transistors being coupled to said common point through current-limiting means.

22. A circuit according to claim 21 wherein said holding transistors and said latch transistors both have common emitter connections coupled to the same current source.

23. A circuit according to claim 22 wherein said same current source is clocked by opposing clocks so either said latch transistors or said holding transistors are activated at a given time but not both.

* * * * *

UNITED STATES PATENT AND TRADEMARK OFFICE
CERTIFICATE OF CORRECTION

PATENT NO. : 5,134,312
DATED : July 28, 1992
INVENTOR(S) : Jones, Jr., et. al.

It is certified that error appears in the above-indentified patent and that said Letters Patent is hereby corrected as shown below:

Column 1, line 31, after "parasitic" insert --capacitances that provided immunity in former geometries are no longer as effective. Several techniques have been published which address this problem.

A technique for hardening latch circuits to the effects of alpha particle hits is described by Okabe et al in "Design for Reducing Alpha-Particle-Induced Soft Errors in ECL Logic Circuitry" published in IEEE Journal of Solid-State Circuits, Oct. 1985, pp. 1397-1403. These circuits were also described by Okabe et al in "An ECL Gate Array Hardened Against Soft Errors", ISSCC Digest of Technical Papers, Feb. 1987. These "soft-error hardened" circuits use a single-ended feedback latch which adds a pair of transistors and a resistor to the feedback path of the latch, thereby limiting amplification of an alpha hit through the emitter follower driving the latch transistors. This technique does increase alpha immunity over standard latch designs, but does not provide the needed amount of immunity for a sub-micron technology. Experimental indications are that an immunity of 200-femtoCoulombs is needed to provide a soft error rate of less than 50 FITs, which is a specified level for marketable devices. The Okabe circuit does not provide this level of immunity in a sub-micron technology, and also the circuit has added complexity

UNITED STATES PATENT AND TRADEMARK OFFICE
CERTIFICATE OF CORRECTION

PATENT NO. : 5,134,312
DATED : July 28, 1992
INVENTOR(S) : Jones, Jr., et. al.

It is certified that error appears in the above-indentified patent and that said Letters Patent is hereby corrected as shown below:

and cost due to adding two transistors and a resistor to the circuit; further the circuit requires an added current source. The extra current source adds to the power dissipation of the latch.

Other circuits for alpha-immune latches have been proposed, but in a similar manner these circuits have introduced additional components, requiring more area, and added power dissipation. Performance has been degraded in these circuits due to added capacitance at the switching nodes, increasing the propagation delay.--

Columns 1, lines 67-68, and Column 2, lines 1-34, delete "capacitances that provided immunity in former geometries are no longer as effective. Several techniques have been published which address this problem.

A technique for hardening latch circuits to the effects of alpha particle hits is described by Okabe et al in "Design for Reducing Alpha-Particle-Induced Soft Errors in ECL Logic Circuitry" published in IEEE Journal of Solid-State Circuits, Oct. 1985, pp. 1397-1403. These circuits were also described by Okabe et al in "An ECL Gate Array Hardened Against Soft Errors", ISSCC Digest of Technical Papers, Feb. 1987. These "soft-error hardened" circuits use a single-ended feedback latch which adds a

UNITED STATES PATENT AND TRADEMARK OFFICE
CERTIFICATE OF CORRECTION

PATENT NO. : 5,134,312
DATED : July 28, 1992
INVENTOR(S) : Jones, Jr., et. al.

It is certified that error appears in the above-indentified patent and that said Letters Patent is hereby corrected as shown below:

pair of transistors and a resistor to the feedback path of the latch, thereby limiting amplification of an alpha hit through the emitter follower driving the latch transistors. This technique does increase alpha immunity over standard latch designs, but does not provide the needed amount of immunity for a sub-micron technology. Experimental indications are that an immunity of 200-femtoCoulombs is needed to provide a soft error rate of less than 50 FITs, which is a specified level for marketable devices. The Okabe circuit does not provide this level of immunity in a sub-micron technology, and also the circuit has added complexity and cost due to adding two transistors and a resistor to the circuit; further the circuit requires an added current source. The extra current source adds to the power dissipation of the latch.

Other circuits for alpha-immune latches have been proposed, but in a similar manner these circuits have introduced additional components, requiring more area, and added power dissipation. Performance has been degraded in these circuits due to added capacitance at the switching nodes, increasing the propagation

UNITED STATES PATENT AND TRADEMARK OFFICE
CERTIFICATE OF CORRECTION

Page 4 of 4

PATENT NO. : 5,134,312
DATED : July 28, 1992
INVENTOR(S) : Jones, Jr., et. al.

It is certified that error appears in the above-indentified patent and that said Letters Patent is hereby corrected as shown below:

delay."

Signed and Sealed this

Twenty-first Day of December, 1993

Attest:

BRUCE LEHMAN

*Attesting Officer*  *Commissioner of Patents and Trademarks*